US010757356B2

(12) United States Patent
Kim et al.

(10) Patent No.: US 10,757,356 B2
(45) Date of Patent: Aug. 25, 2020

(54) COMPARISON DEVICE AND CMOS IMAGE SENSOR INCLUDING THE SAME

(71) Applicant: SK hynix Inc., Gyeonggi-do (KR)

(72) Inventors: Hyeon-June Kim, Jeollanam-do (KR); Tae-Hoon Kim, Gyeonggi-do (KR); Hyun-Mook Park, Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/219,246

(22) Filed: Dec. 13, 2018

(65) Prior Publication Data

US 2019/0335128 A1 Oct. 31, 2019

(30) Foreign Application Priority Data

Apr. 30, 2018 (KR) .......................... 10-2018-0049940

(51) Int. Cl.
*H04N 5/3745* (2011.01)
*H04N 5/378* (2011.01)
*H01L 27/146* (2006.01)
*H04N 5/357* (2011.01)
*H04N 9/04* (2006.01)
*H04N 5/376* (2011.01)

(52) U.S. Cl.
CPC ... *H04N 5/37455* (2013.01); *H01L 27/14645* (2013.01); *H04N 5/357* (2013.01); *H04N 5/378* (2013.01); *H04N 5/3765* (2013.01); *H04N 9/045* (2013.01)

(58) Field of Classification Search
CPC .... H04N 5/37455; H04N 5/378; H04N 5/357; H04N 9/045; H04N 5/3765; H01L 27/14645
See application file for complete search history.

(56) References Cited

U.S. PATENT DOCUMENTS

| 2006/0114342 | A1* | 6/2006 | Egawa | H04N 5/361 348/241 |
| 2010/0091752 | A1* | 4/2010 | Kemmochi | H03H 7/09 370/339 |
| 2014/0070974 | A1* | 3/2014 | Park | H04N 5/3742 341/155 |
| 2019/0035834 | A1* | 1/2019 | Kim | H04N 5/378 |
| 2019/0098245 | A1* | 3/2019 | Kim | H04N 5/37455 |

FOREIGN PATENT DOCUMENTS

JP 10-4683112 B2 5/2011
KR 10-1429512 B1 8/2014

* cited by examiner

*Primary Examiner* — Gevell V Selby
(74) *Attorney, Agent, or Firm* — Perkins Coie LLP

(57) ABSTRACT

Provided are a comparison device that may minimize an influence of banding noise by offsetting the banding noise, and a CMOS image sensor including the comparison device. The comparison device may include a comparison circuit configured to compare a pixel signal and a ramp signal with each other and output a comparison signal, a banding noise adjustment circuit coupled to the comparison circuit to adjust electrical characteristic values of the comparison circuit, a banding value generation circuit coupled to the banding noise adjustment circuit to provide the banding noise adjustment circuit with a banding value generated based on a setting code value, and a banding noise reduction circuit coupled to the banding noise adjustment circuit and configured to reduce the banding noise of the comparison circuit by adjusting electrical characteristic values of the comparison circuit.

20 Claims, 6 Drawing Sheets

COMPARISON DEVICE AND CMOS IMAGE SENSOR INCLUDING THE SAME

CROSS-REFERENCE TO RELATED PATENT DOCUMENTS

This patent document claims the priority and benefits of Korean Patent Application No. 10-2018-0049940, filed on Apr. 30, 2018, which is incorporated herein by reference in its entirety.

TECHNICAL FIELD

The technology and implementations disclosed in this patent document relate to an analog-to-digital conversion device and a complementary metal oxide semiconductor (CMOS) image sensor (CIS).

BACKGROUND

There is a trade-off between operating speed and power consumption in designing a CMOS image sensor (CIS). Accordingly, a current CMOS image sensor technology employs a column-parallel analog-to-digital converter (ADC) architecture to reduce the power consumption while improving the operating speed. A readout circuit with the column-parallel ADC architecture, however, should be highly integrated to match the small size of the photo sensing pixel, and this is why a single-slope ADC having a simple structure is mainly used.

In a CMOS image sensor having the column-parallel architecture, however, adjacent analog-digital-converters may not be separated far enough apart to prevent interference due to the small pixel size, and thus coupling noise may occur between adjacent analog-to-digital converters.

Furthermore, interferences between adjacent analog-digital-converters may also cause banding noise. When a plurality of column-parallel analog-to-digital converters convert analog pixel signals into digital signals, the completion timings of the analog-to-digital conversion may vary depending on the amplitude of the analog pixel signal. As a result, analog-to-digital converters performing the analog-to-digital conversion are affected by adjacent analog-to-digital converters through a current/voltage bias line connected to the column-parallel analog-to-digital converters in common, resulting in unwanted variation in analog-to-digital conversion values.

Since such banding noise occurs for various reasons in an image extraction process and degrades image quality, various tuning points are considered in circuit design in order to minimize the banding noise.

However, it is difficult to minimize the banding noise by simply adjusting the size of a transistor or the amount of a current because a variation in an operation speed or power can cause the performance degradation of an entire system.

SUMMARY

This patent document provides, among others, circuits or devices and their applications in electronic devices or systems that include a reference voltage generator. This patent document also provides a comparison device that can offset banding noise by generating an banding noise offset.

This patent document also provides a comparison device that offsets code delay caused due to banding noise. The code delay may be offset by using a circuit that creates another code delay opposite to the code delay.

In an embodiment, a device may comprise: a comparison circuit configured to compare an input signal with a ramp signal and to output a comparison signal; a banding noise adjustment circuit coupled to the comparison circuit to adjust electrical characteristic values of the comparison circuit; a banding value generation circuit coupled to the banding noise adjustment circuit to provide the banding noise adjustment circuit with a banding value based on a setting code value; and a banding noise reduction circuit coupled to the banding noise adjustment circuit and configured to reduce the banding noise of the comparison circuit based on adjustment of the electrical characteristic values of the comparison circuit.

The banding value generation circuit may generate a banding noise control voltage corresponding to the setting code value, and applies the banding noise control voltage to the banding noise adjustment circuit of each column. The banding value generation circuit may comprise: a storage circuit configured to store the setting code value; a voltage generation circuit coupled to the storage circuit to receive the setting code value and configured to generate the banding noise control voltage corresponding to the setting code value output from the storage circuit; and a voltage transfer circuit coupled to the voltage generation circuit and configured to transfer the banding noise control voltage to the banding noise adjustment circuit. The voltage generation circuit may comprise: a digital-to-analog converter (DAC) configured to generate the banding noise control voltage corresponding to the setting code value stored in the storage circuit. The voltage transfer circuit may comprise: a global buffer configured to transfer the banding noise control voltage generated by the voltage generation circuit to the banding noise adjustment circuit of each column. The banding value generation circuit may further comprise: a voltage stabilization circuit configured to stabilize the banding noise control voltage generated by the voltage generation circuit and apply the stabilized banding noise control voltage to the voltage transfer circuit. The device may further comprise a column buffer provided between the banding value generation circuit and the banding noise adjustment circuit of each column. The banding noise adjustment circuit may adjust the banding noise of the comparison circuit based on resistance of the banding noise adjustment circuit adjustable based on the banding noise control voltage of the banding value generation circuit. The banding noise adjustment circuit may comprise: a plurality of transistors provided between a drain terminal and a gate terminal of a load transistor of the comparison circuit to receive the banding noise control voltage of the banding value generation circuit through gate terminals thereof. The banding noise adjustment circuit may comprise: a plurality of transistors having drain terminals electrically connected to a load network of the comparison circuit, source terminals electrically connected to the banding noise reduction circuit, and gate terminals structured to receive the banding noise control voltage of the banding value generation circuit. The banding noise adjustment circuit may comprise: a first transistor having a drain terminal electrically connected to a drain terminal of a first load transistor of the comparison circuit, a source terminal electrically connected to the banding noise reduction circuit, and a gate terminal structured to receive the banding noise control voltage of the banding value generation circuit; and a second transistor having a drain terminal electrically connected to a drain terminal of a second load transistor of the comparison circuit, a source terminal electrically connected to the banding noise reduction circuit, and a gate terminal structured to receive the banding noise control voltage of the banding value generation circuit. The banding noise reduction circuit may comprise: a sum node electrically connecting the banding noise adjustment circuit to an input network of the comparison circuit. The banding noise reduction circuit may comprise: a first sum node electrically connecting a source terminal of a first transistor of the banding noise adjustment circuit to a drain terminal of a first input transistor of the comparison circuit; and a second sum node electrically connecting a source terminal of a second transistor of the banding noise adjustment circuit to a drain terminal of a second input transistor of the comparison circuit. The setting code value may be received from an external image signal processor (ISP).

In an embodiment, a device having a CMOS image sensor which may comprise: a pixel array including a plurality of imaging pixels arranged in rows and columns to output a pixel signal corresponding to incident light; a row decoder coupled to the pixel array to select and control the plurality of imaging pixels in the pixel array by selecting row lines; a ramp signal generator configured to generate a ramp signal; a comparison circuit configured to compare each pixel signal of the pixel array with the ramp signal of the ramp signal generator; a banding noise adjustment circuit coupled to the comparison circuit to adjust electrical characteristic values of the comparison circuit; a banding value generation circuit coupled to the banding noise adjustment circuit to provide the banding noise adjustment circuit with a banding value generated based on a setting code value; a banding noise reduction circuit coupled to the banding noise adjustment circuit and configured to reduce the banding noise of the comparison circuit by adjusting electrical characteristic values of the comparison circuit; a counting circuit coupled to the comparison circuit to count a number of clock pulses according to each output signal of the comparison circuit; a memory circuit coupled to the counting circuit to store information provided by the counting circuit; a control circuit configured to provide instructions to the row decoder, the ramp signal generator, the comparison circuit, the counting circuit, and the memory circuit; and a column readout circuit configured to output data of the memory circuit based on the instructions provided by the control circuit.

The banding value generation circuit may comprise: a storage circuit configured to store the setting code value; a voltage generation circuit coupled to the storage circuit to receive the setting code value and configured to generate a banding noise control voltage corresponding to the setting code value output from the storage circuit; and a voltage transfer circuit coupled to the voltage generation circuit and configured to transfer the banding noise control voltage to the banding noise adjustment circuit of each column. The banding value generation circuit may further comprise: a voltage stabilization circuit configured to stabilize the banding noise control voltage generated by the voltage generation circuit and apply the stabilized banding noise control voltage to the voltage transfer circuit. The device may further comprise: a column buffer provided between the banding value generation circuit and the banding noise adjustment circuit of each column. The banding noise adjustment circuit may adjust the banding noise of the comparison circuit based on resistance of the banding noise adjustment circuit adjustable based on the banding noise control voltage of the banding value generation circuit. The banding noise adjustment circuit may comprise: a plurality of transistors provided between a drain terminal and a gate terminal of a load transistor of the comparison circuit to receive the banding noise control voltage of the banding value generation circuit through gate terminals thereof.

In an embodiment, a comparison device may include a comparison circuit configured to compare a pixel signal and a ramp signal with each other and output a comparison signal; a banding value generation circuit configured to generate a banding value by using a setting code value; a banding noise adjustment circuit configured to adjust banding noise of the comparison circuit according to the banding value of the banding value generation circuit; and a banding noise reduction circuit configured to reduce the banding noise of the comparison circuit according to an adjustment result of the banding noise adjustment circuit.

In an embodiment, a CMOS image sensor may include a pixel array configured to output a pixel signal corresponding to incident light; a row decoder configured to select and control pixels in the pixel array according to row lines; a ramp signal generator configured to generate a ramp signal; a comparison circuit configured to compare each pixel signal of the pixel array and the ramp signal of the ramp signal generator with each other; a banding value generation circuit configured to generate a banding value by using a setting code value; a banding noise adjustment circuit configured to adjust banding noise of the comparison circuit according to the banding value of the banding value generation circuit; a banding noise reduction circuit configured to reduce the banding noise of the comparison circuit according to an adjustment result of the banding noise adjustment circuit; a counting circuit configured to count a clock according to each output signal of the comparison circuit; a memory circuit configured to store counting information of the counting circuit; a control circuit configured to control operations of the row decoder, the ramp signal generator, the comparison circuit, the counting circuit, and the memory circuit; and a column readout circuit configured to output data of the memory circuit under control of the control circuit.

In accordance with an embodiment, it is possible to minimize an influence of banding noise through offset of the banding noise.

Furthermore, in accordance with an embodiment, in order to offset code delay due to banding noise, a circuit that causes code delay opposite to the code delay is provided to offset the code delay due to the banding noise, so that it is possible to minimize an influence of the banding noise.

DETAILED DESCRIPTION

Figure 1A:
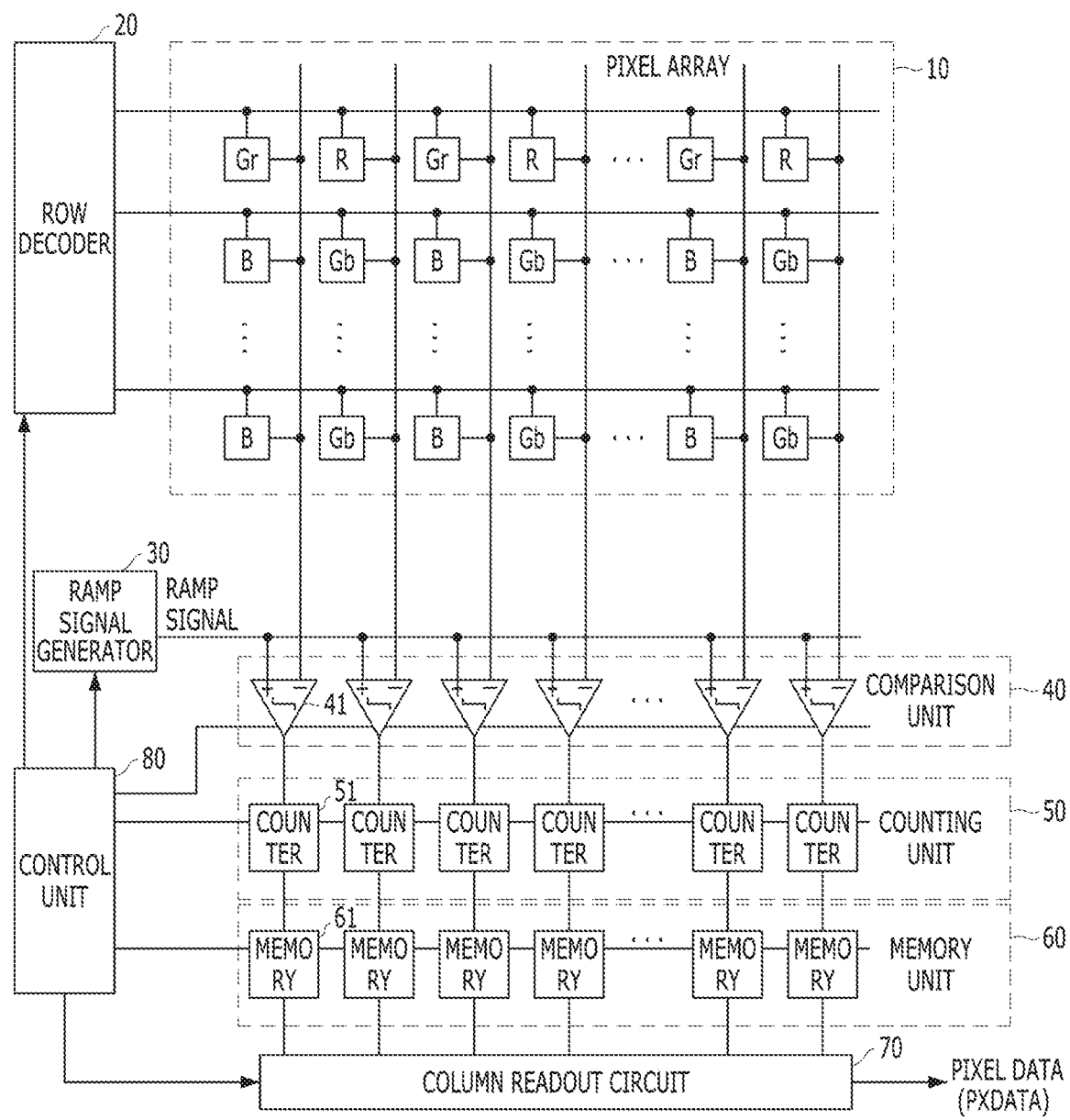
FIG. 1A is a diagram of a CMOS image sensor for facilitating the understanding of various embodiments of the disclosed technology.

FIG. 1A is a diagram of a CMOS image sensor for facilitating the understanding of various embodiments of the disclosed technology, and illustrates a CMOS image sensor having a column parallel structure implemented using an example single slope analog-to-digital converter.

As illustrated in FIG. 1A, the CMOS image sensor may include a pixel array 10 of imaging pixels arranged in rows and columns to output a pixel signal corresponding to incident light, a row decoder 20, a ramp signal generator 30, a comparison circuit 40, a counting circuit 50, a memory circuit 60, a control circuit 80, and a column readout circuit 70.

Each imaging pixel of the pixel array 10 may be implemented by a photo diode, a photo transistor, a photo gate, or other photosensitive circuitry capable of converting light into a pixel signal (e.g., a charge, a voltage or a current). On top of the imaging pixels, different color filters are placed to cover the photosensing pixels, respectively, to filter the incident light in different colors at different pixel locations to capture the color information in a sensed image. The specific example in FIG. 1A shows a pixel arrangement of colored imaging pixels labeled as "R" for a red colored pixel, "G" for a green colored pixel, and "B" for a blue colored pixel. One example for arranging the color filters is the well-known Bayer color filter pattern of a repetitive Bayer color filter unit patterns with each unit pattern having two green color filter pixels, one blue color filter pixel, and one red color filter pixel.

The row decoder 20 selects pixels in the pixel array 10 by selecting row lines and controls operations of the pixels based on instructions of the control circuit 80. The ramp signal generator 30 generates a ramp signal based on instructions of the control circuit 80. The comparison circuit 40 compares a value of the ramp signal applied from the ramp signal generator 30 with values of each pixel signal outputted from the pixel array 10 based on instructions of the control circuit 80. The counting circuit 50 counts a number of clock pulses of the control circuit 80 according to each output signal of the comparison circuit 40. The memory circuit 60 stores information (e.g., the number of clock pulses) provided by the counting circuit 50 based on instructions of the control circuit 80. The control circuit 80 controls the operations of the row decoder 20, the ramp signal generator 30, the comparison circuit 40, the counting circuit 50, the memory circuit 60, and the column readout circuit 70. The column readout circuit 70 sequentially outputs data stored in the memory circuit 60 as pixel data PXDATA based on instructions of the control circuit 80.

Some CMOS image sensors utilize correlated double sampling (CDS) to remove an unwanted offset by measuring pixel signals twice and comparing them with each other. For example, pixel signals, which are output voltages from the pixel array 10, are measured before and after light is incident, and are compared with each other in order to remove an offset value of pixels. In an example embodiment of the disclosed technology, such a CDS operation may be performed by the comparison circuit 40.

The comparison circuit 40 includes a plurality of comparators. The counting circuit 50 includes a plurality of counters. The memory circuit 60 includes a plurality of memories. In an embodiment of the disclosed technology, each column includes one or more comparators, one or more counters, and one or more memories.

Next, with reference to FIG. 1A, operations of an example column architecture that includes one comparator, one counter, and one memory will be described below as an example.

A first comparator 41 has two input terminals that receive a pixel signal outputted from a column of the pixel array 10 and a ramp signal applied from the ramp signal generator 30, respectively, to compare values of the two signals with each other according to a control signal of the control circuit 80, and outputs a comparison signal.

Since the ramp signal $V_{RAMP}$ is a signal whose voltage level decreases or increases, there should be a point in time at which the values of the two signals inputted to each comparator coincide with each other. After the values of the two signals becomes identical, values of output signals of each comparator are inverted.

In some embodiments of the disclosed technology, a first counter 51 counts the number of clock pulses of the control circuit 80 from a time point at which the ramp signal starts to decrease to a time point at which the comparison signal output from the comparator 41 is inverted, and outputs information indicating the number of clock pulses. The respective counters are initialized according to a reset control signal from the control circuit 80.

Then, a first memory 61 stores the information output from the first comparator 51 according to a load control signal of the control circuit 80, and outputs the information to the column readout circuit 70.

In some embodiments of the disclosed technology, the CMOS image sensor may perform the "clock counting" on a reset signal (e.g., a reset voltage) and then is performed on a video signal (e.g., a signal voltage).

Figure 1B:
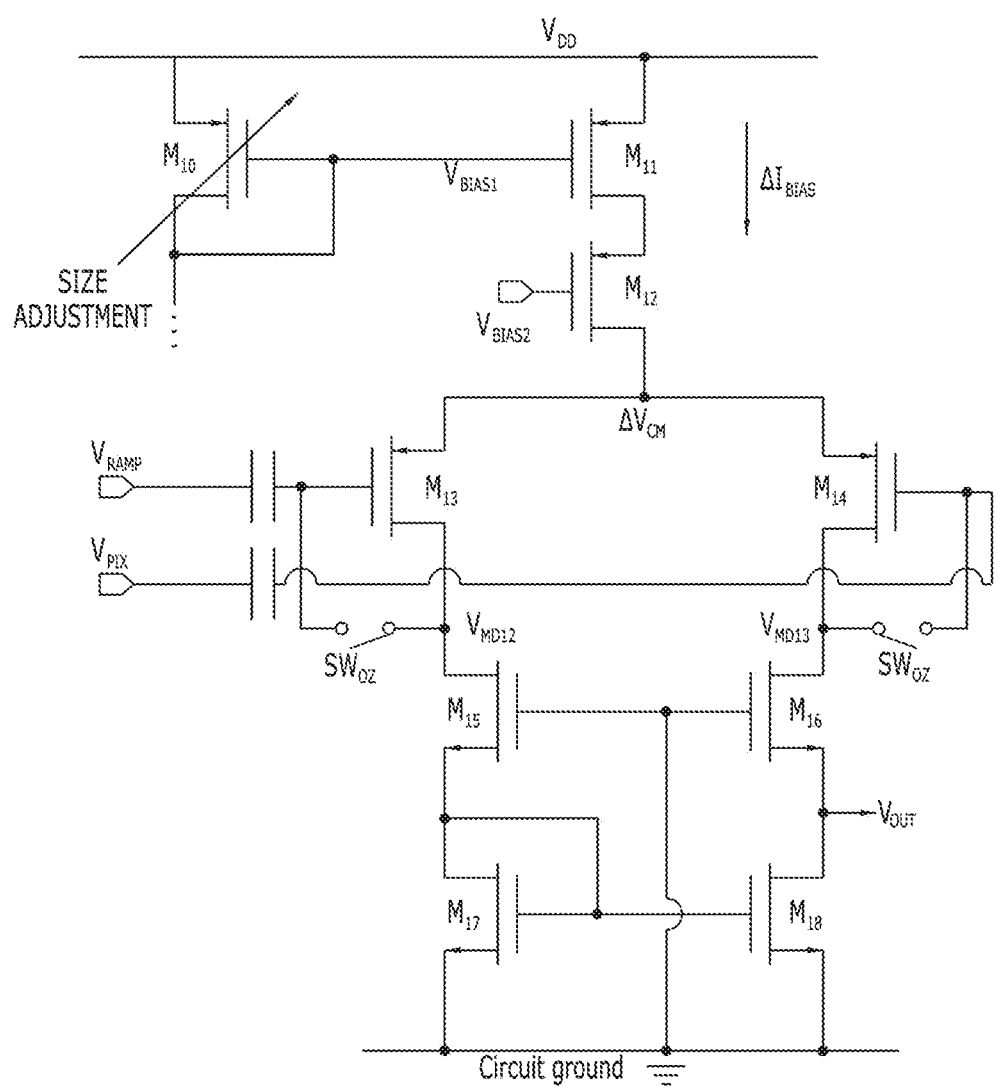
FIG. 1B is a diagram of an example of a comparator illustrated in FIG. 1A.

FIG. 1B is a diagram of an example of the comparator 41 illustrated in FIG. 1A.

A CMOS image sensor is subject to different types of noise. One example is the banding noise occurs in reading out one line of imaging pixels on a line by line basis and different lines of imaging pixels may be subject to different noise in the readout in various forms in an image extraction process. Such banding noise can degrade the image quality so that various tuning points are considered in circuit design in order to minimize the banding noise.

For example, as illustrated in FIG. 1B, in order to minimize the banding noise, a bias current $I_{BIAS1}$ inputted to a gate terminal of a PMOS transistor $M_{11}$ is adjusted by adjusting the size of a PMOS transistor $M_{10}$. However, since such a method is limited because it may change a DC bias point of a comparator.

In this regard, in order to offset code delay caused due to banding noise, an image sensor implemented based on an embodiment of the disclosed technology may include a circuit that creates another code delay opposite to the code delay to offset the code delay caused due to the banding noise, thereby minimizing an influence of the banding noise. For example, when "+" banding noise occurs, "−" banding noise is generated to offset the noise and when "−" banding noise occurs, "+" banding noise is generated to offset the noise. This will be described in detail with reference to FIG. 2, FIG. 3, FIGS. 4A and 4B, and FIG. 5.

Figure 2:
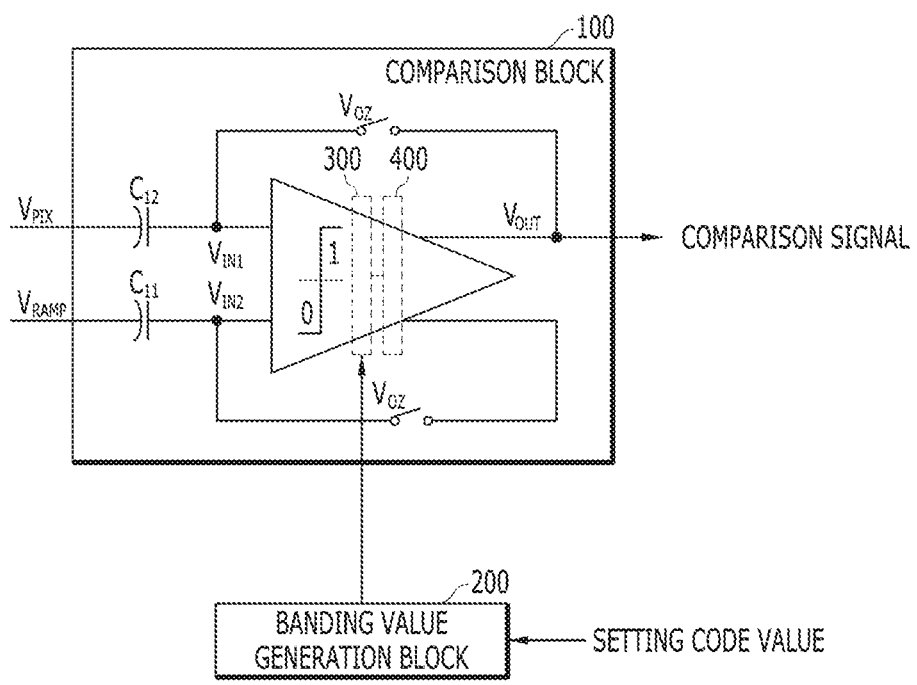
FIG. 2 is a diagram of an example of a comparison device implemented based on an embodiment of the disclosed technology.

FIG. 2 is a diagram of an example of a comparison device implemented based on an embodiment of the disclosed technology.

As illustrated in FIG. 2, the comparison device implemented based on an embodiment of the disclosed technology includes a comparison circuit 100 that has a banding value generation circuit 200 and a banding noise adjustment circuit 300. In another embodiment of the disclosed technology, the comparison device may include a banding value generation circuit 200, a banding noise adjustment circuit 300, and a comparison circuit 100 that is separate from the banding value generation circuit 200 and the banding noise adjustment circuit 300. For example, the comparison circuit 100 may indicate circuits outside reference numerals 200, 300, and 400 in FIG. 3. The comparison circuit 100 may compare a pixel signal $V_{PIX}$ with a ramp signal $V_{RAMP}$ with and output a comparison signal. The banding value generation circuit 200 may generate a banding value by using a setting code value. The banding noise adjustment circuit 300 may adjust banding noise of the comparison circuit 100 according to the banding value generated by the banding value generation circuit 200. The banding noise reduction circuit 400 may reduce the banding noise of the comparison circuit 100 based on an adjustment result of the banding noise adjustment circuit 300.

In an implementation of the disclosed technology, the banding value may be an analog voltage value that can be used to adjust electrical characteristic values of the comparison circuit 100, and the setting code value may be a digital code that is to be converted into the analog voltage value corresponding to the digital code. For example, the banding value generation circuit 200 generates a banding noise control voltage $V_{BD}$ corresponding to the setting code value, and applies the banding noise control voltage $V_{BD}$ to the banding noise adjustment circuit 300 to adjust electrical characteristic values of the comparison circuit 100. Here, the banding noise control voltage may indicate a voltage that is applied to the banding noise adjustment circuit 300 to offset the banding noise by adjusting electrical characteristic values of the banding noise adjustment circuit 300. In an embodiment of the disclosed technology, the banding value generation circuit 200 applies the banding noise control voltage $V_{BD}$ to all the banding noise adjustment circuits 300 of all columns. The banding value generation circuit 200 will be described later with reference to FIGS. 4A and 4B.

The banding noise adjustment circuit 300 may offset the banding noise of the comparison circuit 100 by adjusting electrical characteristic values such as transconductance of the banding noise adjustment circuit 300. Here, resistance of the banding noise adjustment circuit 300 may be adjusted based on the banding noise control voltage $V_{BD}$ of the banding value generation circuit 200.

The comparison circuit 100 may be implemented in various forms. In an example implementation of the disclosed technology, the comparison circuit 100 may include more than one level. In a multi-level comparison circuit, the banding noise adjustment circuit 300 and the banding noise reduction circuit 400 may be implemented in a first step (or a first level) of the comparison circuit 100, or may be implemented in other steps/levels of the comparison circuit 100.

As described above, the comparison device illustrated in FIG. 2 includes the banding value generation circuit 200, the banding noise adjustment circuit 300, and the banding noise reduction circuit 400. This will be described below in detail with reference to FIG. 3, FIGS. 4A and 4B, and FIG. 5.

Figure 3:
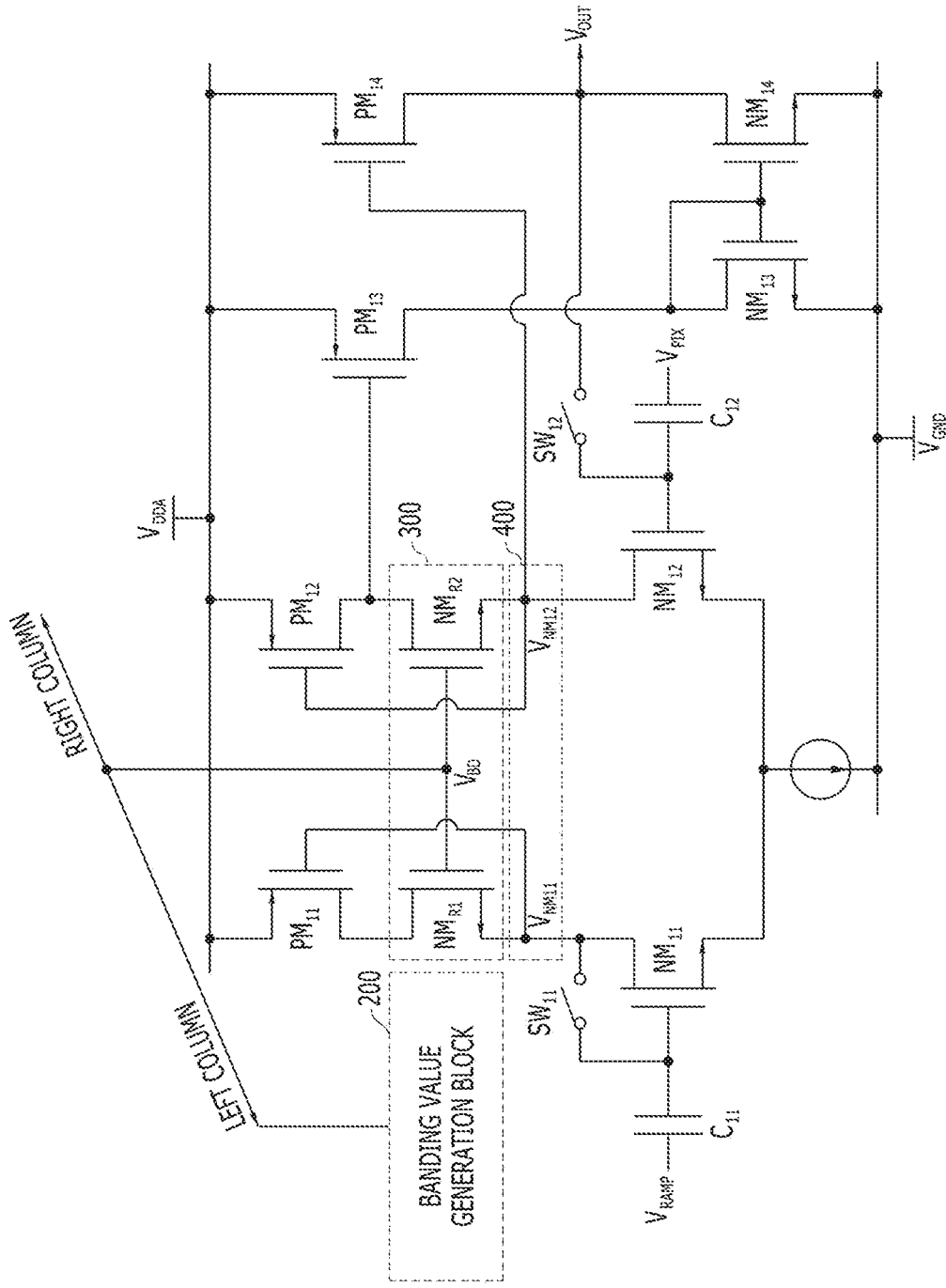
FIG. 3 is a diagram of an example of a comparison device illustrated in FIG. 2.

FIG. 3 is a diagram of an example of the comparison device illustrated in FIG. 2.

Since various types of comparison circuits are known in the art, further discussion of the comparison circuit 100 is omitted here.

As illustrated in FIG. 3, the banding noise adjustment circuit 300 includes a NMOS transistor $NM_{R1}$ and a NMOS transistor $NM_{R2}$, which are provided between a drain terminal and a gate terminal of load transistors $PM_{11}$ and $PM_{12}$ of the comparison circuit 100 to receive, through gate terminals thereof, the banding noise control voltage $V_{BD}$ generated by the banding value generation circuit 200. That is, the banding noise adjustment circuit 300 includes the NMOS transistor $NM_{R1}$ and the NMOS transistor $NM_{R2}$ having drain terminals electrically connected to a load network, drain terminals of the load transistors $PM_{11}$ and $PM_{12}$, of the comparison circuit 100, source terminals electrically connected to the banding noise reduction circuit 400, and gate terminals that receive the banding noise control voltage $V_{BD}$ of the banding value generation circuit 200. In other words, the banding noise adjustment circuit 300 includes the NMOS transistor $NM_{R1}$ having the drain terminal electrically connected to a drain terminal of a PMOS transistor $PM_{11}$ (a first load transistor) of the comparison circuit 100, the source terminal electrically connected to the banding noise reduction circuit 400, and the gate terminal that receives the banding noise control voltage $V_{BD}$ of the banding value generation circuit 200. The banding noise adjustment circuit 300 also includes the NMOS transistor $NM_{R2}$ having the drain terminal electrically connected to a drain terminal of a PMOS transistor $PM_{12}$ (a second load transistor) of the comparison circuit 100, the source terminal electrically connected to the banding noise reduction circuit 400, and the gate terminal for receiving the banding noise control voltage $V_{BD}$ of the banding value generation circuit 200. In another implementation of the disclosed technology, the banding noise adjustment circuit 300 may be implemented using PMOS transistors instead of the NMOS transistor $NM_{R1}$ and the NMOS transistor $NM_{R2}$.

The banding noise reduction circuit 400 includes sum nodes $VNM_{11}$ and $VNM_{12}$, which connect the banding noise adjustment circuit 300 to an input network, input terminals of the ramp signal $V_{RAMP}$ and the pixel signal $V_{PIX}$, of the comparison circuit 100. That is, the banding noise reduction circuit 400 includes the first sum node $VNM_{11}$, which connects the source terminal of the NMOS transistor $NM_{R1}$ of the banding noise adjustment circuit 300 to a drain terminal of a NMOS transistor $NM_{11}$ (a first input transistor) of the comparison circuit 100. The banding noise reduction circuit 400 also includes the second sum node $VNM_{12}$, which connects the source terminal of the NMOS transistor $NM_{R2}$ of the banding noise adjustment circuit 300 to a drain terminal of a NMOS transistor $NM_{12}$ (a second input transistor) of the comparison circuit 100.

The NMOS transistor $NM_{R1}$ and the NMOS transistor $NM_{R2}$ operate in a triode region and the amount of resistance thereof is adjusted based on the banding noise control voltage $V_{BD}$ of the banding value generation circuit 200, which is applied to the gate terminals thereof. By adjusting the amount of the resistance based on the banding noise control voltage $V_{BD}$ of the banding value generation circuit 200, it is possible to adjust an input common level, which is an applicable input signal range of the NMOS transistor $NM_{11}$ and the NMOS transistor $NM_{12}$ (the input transistors), in a reset operation of the comparison circuit 100 ($SW_{11}$ and $SW_{12}$ are turned on and gate voltages of the NMOS transistor $NM_{11}$ and the NMOS transistor $NM_{12}$ are decided). That is, when the resistance of the NMOS transistors $NM_{R1}$ and $NM_{R2}$ of the banding noise adjustment circuit 300 is adjusted based on the banding noise control voltage $V_{BD}$ of the banding value generation circuit 200, it is possible to adjust the transfer conductance (gm) of the input transistors. In this case, the resistance of the NMOS transistors $NM_{R1}$ and $NM_{R2}$ can be adjusted to the extent that the input common level is not problematic even when the output signal of the imaging pixel is at a low amplitude range. The gain of the comparison circuit 100 is changed according to such adjustment results. In addition, changes in the gain of the comparison circuit 100 may lead to a code delay.

In this regard, in order to offset the banding noise occurring in an analog-to-digital converter (ADC), the banding noise control voltage $V_{BD}$ is generated such that banding noise of an opposite polarity is caused and is applied to the NMOS transistor $NM_{R1}$ the NMOS transistor $NM_{12}$ of the banding noise adjustment circuit 300, thereby offsetting code delay caused due to the banding noise.

Figure 4A:
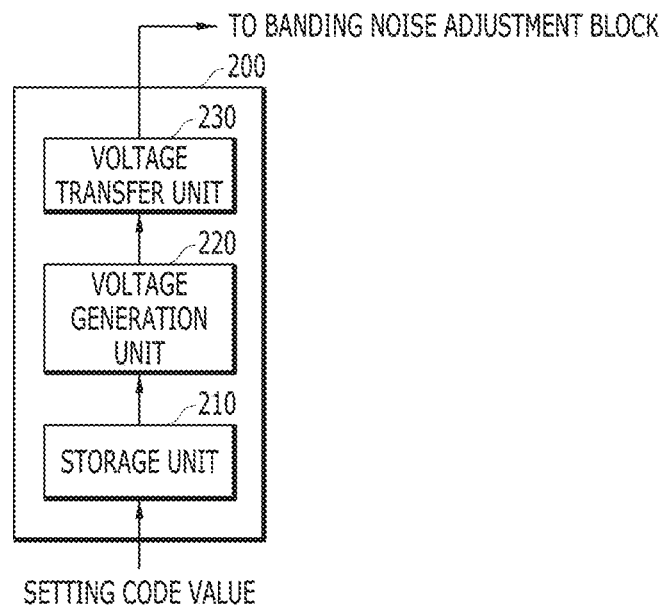
FIG. 4A is a diagram of an example of a banding value generation circuit illustrated in FIG. 2 and FIG. 3.
Figure 4B:
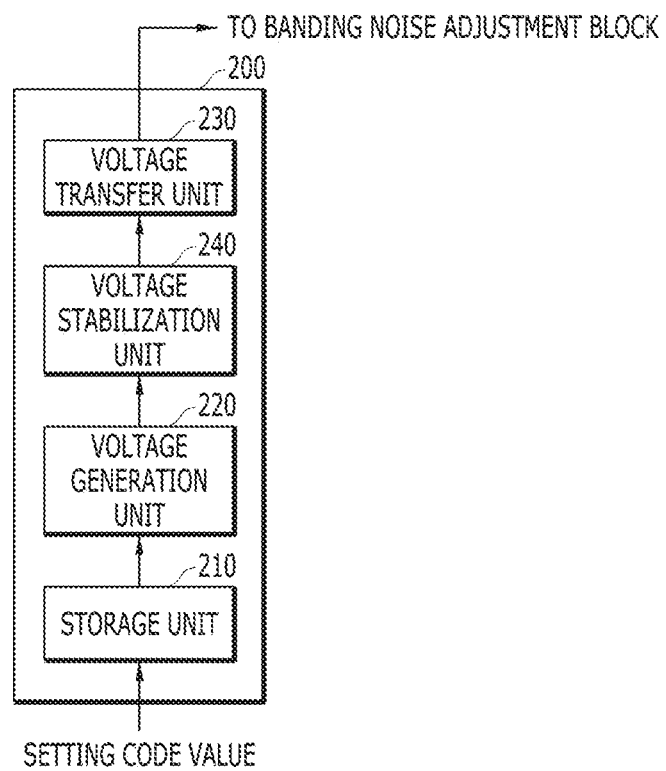
FIG. 4B is a diagram of another example of a banding value generation circuit illustrated in FIG. 2 and FIG. 3.

FIG. 4A is a diagram of an example of the banding value generation circuit 200 illustrated in FIG. 2 and FIG. 3, and FIG. 4B is a diagram of another example of the banding value generation circuit 200 illustrated in FIG. 2 and FIG. 3.

As illustrated in FIG. 4A, the banding value generation circuit 200 includes a storage circuit 210, a voltage generation circuit 220, and a voltage transfer circuit 230. The storage circuit 210 may store the setting code value which is used to generate the banding noise control voltage. The voltage generation circuit 220 may generate the banding noise control voltage $V_{BD}$ corresponding to the setting code value of the storage circuit 210. The voltage transfer circuit 230 may transfer the banding noise control voltage $V_{BD}$ generated in the voltage generation circuit 220 to the banding noise adjustment circuit 300.

The storage circuit 210, for example, may be implemented with a register circuit. The storage circuit 210 may be implemented to store a preset setting code value. Alternatively, the storage circuit 210 may be implemented to receive the setting code value from an external image signal processor (ISP) and the like and store the setting code value.

The voltage generation circuit 220 may be implemented using a digital-to-analog converter (DAC) that is coupled to the storage circuit 210 and generates the banding noise control voltage $V_{BD}$ corresponding to the setting code value stored in the storage circuit 210. In this case, the digital-to-analog converter (DAC) may be implemented using a basic structure of a resistive digital-to-analog converter (R-DAC) including a resistor array or a capacitive digital-to-analog converter (C-DAC) including a capacitor array.

The voltage transfer circuit 230 may be implemented using a global buffer that is coupled to the voltage generation circuit 220 and transfer the banding noise control voltage $V_{BD}$ generated in the voltage generation circuit 220 to the banding noise adjustment circuits 300 of all columns. For example, the global buffer may be implemented using a simple source follower circuit.

Since the banding value generation circuit 200, which generates the banding noise control voltage $V_{BD}$ applied to all the banding noise adjustment circuits 300 of all columns, may be a noise source that produces another banding noise, a column buffer is provided between the banding value generation circuit 200 and the banding noise adjustment circuit 300 of each column to reduce/minimize banding noise.

As illustrated in FIG. 4B, the banding value generation circuit 200 further includes a voltage stabilization circuit 240 to stabilize the banding noise control voltage $V_{BD}$ generated by the voltage generation circuit 220 and apply the stabilized banding noise control voltage $V_{BD}$ to the voltage transfer circuit 230. In an embodiment of the disclosed technology, the voltage stabilization circuit 240 may be coupled between the voltage transfer circuit 230 and the voltage generation circuit 220. For example, the voltage stabilization circuit 240 may be implemented using a bandgap voltage reference (BGR) circuit.

Figure 5:
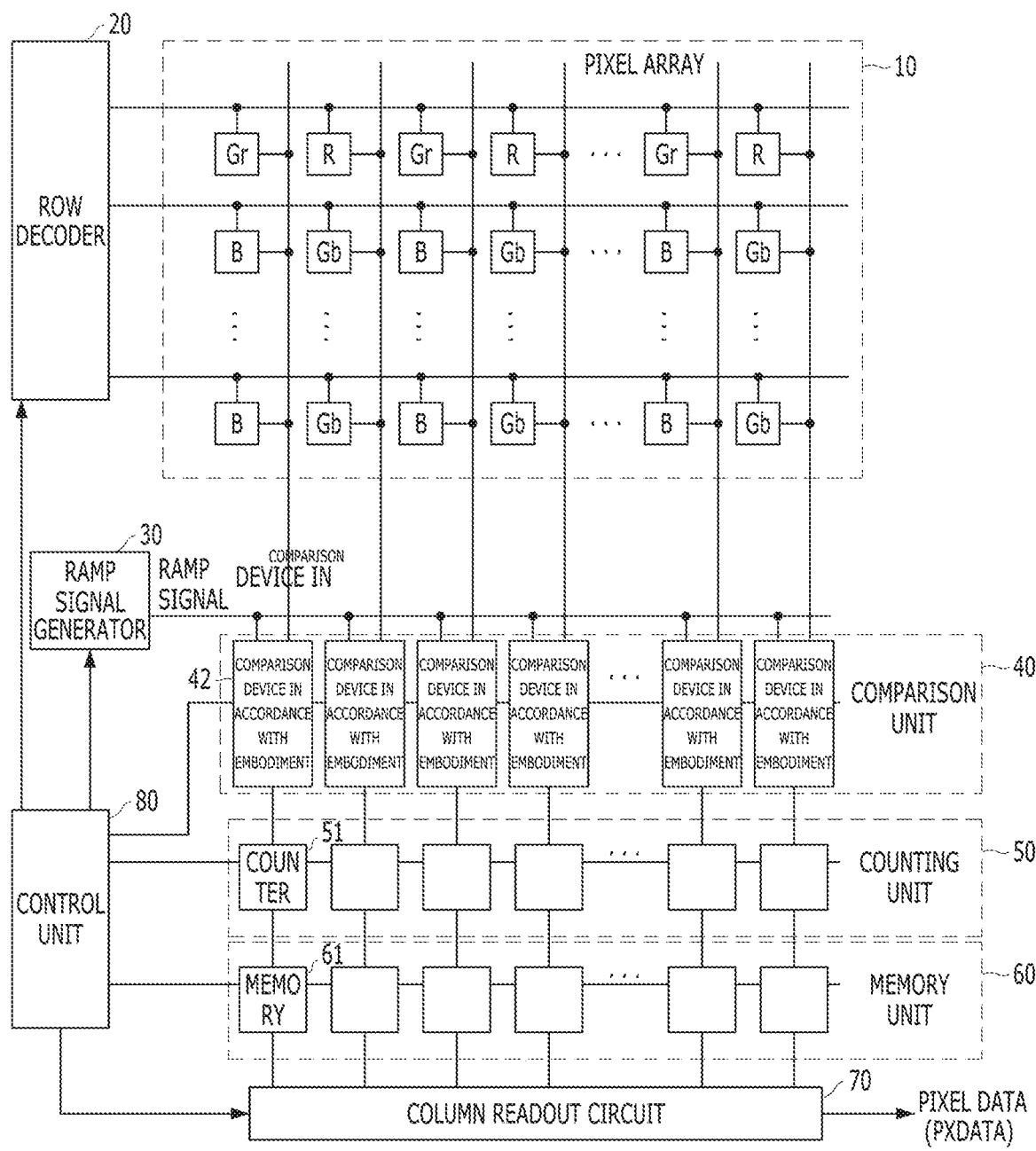
FIG. 5 is a diagram of an example of a CMOS image sensor implemented based on an embodiment of the disclosed technology.

FIG. 5 is a diagram of an example of a CMOS image sensor implemented based on an embodiment of the disclosed technology.

As illustrated in FIG. 5, the CMOS image sensor includes a pixel array 10 of imaging pixels arranged in rows and columns to output a pixel signal corresponding to incident light, a row decoder 20, a ramp signal generator 30, a comparison circuit 40, a counting circuit 50, a memory circuit 60, a control circuit 80, and a column readout circuit 70. The row decoder 20 selects pixels in the pixel array 10 by selecting row lines and controls operations of the pixels based on instructions of the control circuit 80. The ramp signal generator 30 generates a ramp signal based on instructions of the control circuit 80. The comparison circuit 40 compares a value of the ramp signal applied from the ramp signal generator 30 with values of each pixel signal outputted from the pixel array 10 based on instructions of the control circuit 80. The counting circuit 50 counts a number of clock pulses of control circuit 80 according to each output signal of the comparison circuit 40. The memory circuit 60 stores information (e.g., the number of clock pulses) provided by the counting circuit 50 based on instructions of the control circuit 80. The control circuit 80 controls the operations of the row decoder 20, the ramp signal generator 30, the comparison circuit 40, the counting circuit 50, the memory circuit 60, and the column readout circuit 70. The column readout circuit 70 sequentially outputs data stored in the memory circuit 60 as pixel data PXDATA based on instructions of the control circuit 80. The comparison circuit 40 is implemented using the comparison device 42 based on some embodiments of the disclosed technology.

Although various embodiments have been described for illustrative purposes, it will be apparent to those skilled in the art that various changes and modifications may be made without departing from the spirit and scope of the invention as defined in the following claims.

What is claimed is:

1. A device comprising:
   a comparison circuit configured to compare an input signal with a ramp signal and to output a comparison signal;
   a banding noise adjustment circuit coupled to the comparison circuit to offset a banding noise of the comparison circuit by adjusting electrical characteristic values of the comparison circuit;
   a banding value generation circuit coupled to the banding noise adjustment circuit to provide the banding noise adjustment circuit with a banding value based on a setting code value; and
   a banding noise reduction circuit coupled to the banding noise adjustment circuit and configured to reduce the banding noise of the comparison circuit based on adjustment of the electrical characteristic values of the comparison circuit.

2. The device of claim 1, wherein the banding value generation circuit generates a banding noise control voltage corresponding to the setting code value, and applies the banding noise control voltage to the banding noise adjustment circuit of each column.

3. The device of claim 1, further comprising:
   a column buffer provided between the banding value generation circuit and the banding noise adjustment circuit of each column.

4. The device of claim 1, wherein the banding noise adjustment circuit adjusts the banding noise of the comparison circuit based on resistance of the banding noise adjustment circuit adjustable based on the banding noise control voltage of the banding value generation circuit.

5. The device of claim 1, wherein the banding noise adjustment circuit comprises:
   a plurality of transistors provided between a drain terminal and a gate terminal of a load transistor of the comparison circuit to receive the banding noise control voltage of the banding value generation circuit through gate terminals thereof.

6. The device of claim 1, wherein the banding noise adjustment circuit comprises:
a plurality of transistors having drain terminals electrically connected to a load network of the comparison circuit, source terminals electrically connected to the banding noise reduction circuit, and gate terminals structured to receive the banding noise control voltage of the banding value generation circuit.

7. The device of claim 1, wherein the banding noise adjustment circuit comprises:
a first transistor having a drain terminal electrically connected to a drain terminal of a first load transistor of the comparison circuit, a source terminal electrically connected to the banding noise reduction circuit, and a gate terminal structured to receive the banding noise control voltage of the banding value generation circuit; and
a second transistor having a drain terminal electrically connected to a drain terminal of a second load transistor of the comparison circuit, a source terminal electrically connected to the banding noise reduction circuit, and a gate terminal structured to receive the banding noise control voltage of the banding value generation circuit.

8. The device of claim 1, wherein the banding noise reduction circuit comprises:
a sum node electrically connecting the banding noise adjustment circuit to an input network of the comparison circuit.

9. The device of claim 1, wherein the banding noise reduction circuit comprises:
a first sum node electrically connecting a source terminal of a first transistor of the banding noise adjustment circuit to a drain terminal of a first input transistor of the comparison circuit; and
a second sum node electrically connecting a source terminal of a second transistor of the banding noise adjustment circuit to a drain terminal of a second input transistor of the comparison circuit.

10. The device of claim 1, wherein the setting code value is received from an external image signal processor (ISP).

11. A device comprising:
a comparison circuit configured to compare an input signal with a ramp signal and to output a comparison signal;
a banding noise adjustment circuit coupled to the comparison circuit to adjust electrical characteristic values of the comparison circuit;
a banding value generation circuit coupled to the banding noise adjustment circuit to provide the banding noise adjustment circuit with a banding value based on a setting code value; and
a banding noise reduction circuit coupled to the banding noise adjustment circuit and configured to reduce the banding noise of the comparison circuit based on adjustment of the electrical characteristic values of the comparison circuit,
wherein the banding value generation circuit generates a banding noise control voltage corresponding to the setting code value, and applies the banding noise control voltage to the banding noise adjustment circuit of each column,
wherein the banding value generation circuit comprises:
a storage circuit configured to store the setting code value;
a voltage generation circuit coupled to the storage circuit to receive the setting code value and configured to generate the banding noise control voltage corresponding to the setting code value output from the storage circuit; and
a voltage transfer circuit coupled to the voltage generation circuit and configured to transfer the banding noise control voltage to the banding noise adjustment circuit.

12. The device of claim 11, wherein the voltage generation circuit comprises:
a digital-to-analog converter (DAC) configured to generate the banding noise control voltage corresponding to the setting code value stored in the storage circuit.

13. The device of claim 11, wherein the voltage transfer circuit comprises:
a global buffer configured to transfer the banding noise control voltage generated by the voltage generation circuit to the banding noise adjustment circuit of each column.

14. The device of claim 11, wherein the banding value generation circuit further comprises:
a voltage stabilization circuit configured to stabilize the banding noise control voltage generated by the voltage generation circuit and apply the stabilized banding noise control voltage to the voltage transfer circuit.

15. A device having a CMOS image sensor which comprises:
a pixel array including a plurality of imaging pixels arranged in rows and columns to output a pixel signal corresponding to incident light;
a row decoder coupled to the pixel array to select and control the plurality of imaging pixels in the pixel array by selecting row lines;
a ramp signal generator configured to generate a ramp signal;
a comparison circuit configured to compare each pixel signal of the pixel array with the ramp signal of the ramp signal generator;
a banding noise adjustment circuit coupled to the comparison circuit to offset a banding noise of the comparison circuit by adjusting electrical characteristic values of the comparison circuit;
a banding value generation circuit coupled to the banding noise adjustment circuit to provide the banding noise adjustment circuit with a banding value generated based on a setting code value;
a banding noise reduction circuit coupled to the banding noise adjustment circuit and configured to reduce the banding noise of the comparison circuit by adjusting electrical characteristic values of the comparison circuit;
a counting circuit coupled to the comparison circuit to count a number of clock pulses according to each output signal of the comparison circuit;
a memory circuit coupled to the counting circuit to store information provided by the counting circuit;
a control circuit configured to provide instructions to the row decoder, the ramp signal generator, the comparison circuit, the counting circuit, and the memory circuit; and
a column readout circuit configured to output data of the memory circuit based on the instructions provided by the control circuit.

16. The device of claim 15, wherein the banding value generation circuit comprises:
a storage circuit configured to store the setting code value;
a voltage generation circuit coupled to the storage circuit to receive the setting code value and configured to generate a banding noise control voltage corresponding to the setting code value output from the storage circuit; and a voltage transfer circuit coupled to the voltage generation circuit and configured to transfer the banding noise control voltage to the banding noise adjustment circuit of each column.

17. The device of claim 16, wherein the banding value generation circuit further comprises:
a voltage stabilization circuit configured to stabilize the banding noise control voltage generated by the voltage generation circuit and apply the stabilized banding noise control voltage to the voltage transfer circuit.

18. The device of claim 15, further comprising:
a column buffer provided between the banding value generation circuit and the banding noise adjustment circuit of each column.

19. The device of claim 15, wherein the banding noise adjustment circuit adjusts the banding noise of the comparison circuit based on resistance of the banding noise adjustment circuit adjustable based on the banding noise control voltage of the banding value generation circuit.

20. The device of claim 15, wherein the banding noise adjustment circuit comprises:
a plurality of transistors provided between a drain terminal and a gate terminal of a load transistor of the comparison circuit to receive the banding noise control voltage of the banding value generation circuit through gate terminals thereof.

* * * * *